(12) United States Patent
Bruel

(10) Patent No.: US 9,343,351 B2
(45) Date of Patent: May 17, 2016

(54) PROCESS FOR TRANSFERRING A LAYER

(71) Applicant: Soitec, Bernin (FR)

(72) Inventor: Michel Bruel, Veurey-voroize (FR)

(73) Assignee: Soitec, Bernin (FR)

( * ) Notice: Subject to any disclaimer, the term of this patent is extended or adjusted under 35 U.S.C. 154(b) by 0 days.

(21) Appl. No.: 14/409,361

(22) PCT Filed: Jun. 14, 2013

(86) PCT No.: PCT/IB2013/001252
§ 371 (c)(1),
(2) Date: Dec. 18, 2014

(87) PCT Pub. No.: WO2014/001869
PCT Pub. Date: Jan. 3, 2014

(65) Prior Publication Data
US 2015/0187638 A1  Jul. 2, 2015

(30) Foreign Application Priority Data
Jun. 26, 2012 (FR) ...................... 12 01802

(51) Int. Cl.
| H01L 21/30 | (2006.01) |
| H01L 29/04 | (2006.01) |
| H01L 21/762 | (2006.01) |
| H01L 51/50 | (2006.01) |

(52) U.S. Cl.
CPC ...... H01L 21/76254 (2013.01); H01L 51/5024 (2013.01)

(58) Field of Classification Search
CPC .............. H01L 21/76254; H01L 51/5024
USPC ............... 438/455, 107; 257/628, 783
See application file for complete search history.

(56) References Cited

U.S. PATENT DOCUMENTS

| 6,291,314 B1 * | 9/2001 | Henley et al. ............. 438/458 |
| 6,486,008 B1 | 11/2002 | Lee |
| 7,052,978 B2 * | 5/2006 | Shaheen et al. ............. 438/463 |
| 8,012,256 B2 | 9/2011 | Brüderl et al. |
| 2002/0146893 A1 | 10/2002 | Shimoda et al. |
| 2005/0048738 A1 | 3/2005 | Shaheen et al. |

FOREIGN PATENT DOCUMENTS

EP     2315268 A2     4/2011

OTHER PUBLICATIONS

International Search Report for International Application No. PCT/IB2013/001252 dated Aug. 12, 2013, 4 pages.

* cited by examiner

Primary Examiner — Calvin Lee
(74) Attorney, Agent, or Firm — TraskBritt

(57) ABSTRACT

This transfer process comprises the following steps: (a) providing a donor substrate and a support substrate; (b) forming an embrittlement region in the donor substrate; (c) forming what is called a bonding layer between the first part of the donor substrate and the support substrate; and (d) assembling the donor substrate to the support substrate, and is noteworthy in that it comprises the following step: (e) exposing, in succession, portions of the embrittlement region to electromagnetic irradiations for an exposure time at a given power density, the exposure time being chosen depending on the thickness of the bonding layer so that the support substrate is thermally decoupled from the first part of the donor substrate, the exposure time being chosen depending on the power density in order to activate kinetics that weaken the embrittlement region.

20 Claims, 2 Drawing Sheets

PROCESS FOR TRANSFERRING A LAYER

CROSS-REFERENCE TO RELATED APPLICATIONS

This application is a national phase entry under 35 U.S.C. §371 of International Patent Application PCT/IB2013/001252, filed Jun. 14, 2013, designating the United States of America and published in English as International Patent Publication WO 2014/001869 A1 on Jan. 3, 2014, which claims the benefit under Article 8 of the Patent Cooperation Treaty and under 35 U.S.C. §119(e) to French Patent Application Serial No. 1201802, filed Jun. 26, 2012, the disclosure of each of which is hereby incorporated herein in its entirety by this reference.

TECHNICAL FIELD

The disclosure relates to a process for transferring a layer.

BACKGROUND

A known prior-art process for transferring a layer, called the SMART CUT® process, comprises the following steps:
(a) providing a donor substrate and a support substrate made of materials having a first and second thermal expansion coefficient, respectively;
(b) forming an embrittlement region in the donor substrate so as to delimit a first part and a second part in the donor substrate on either side of the embrittlement region, the first part being intended to form the layer to be transferred to the support substrate;
(c) forming what is called a bonding layer between the first part of the donor substrate and the support substrate, the bonding layer having a preset thickness; and
(d) assembling the donor substrate to the support substrate.

The donor substrate and the support substrate are conventionally subjected to a temperature increase in step (d). The donor substrate and the support substrate are also subjected to a temperature increase in subsequent steps consisting in:
fracturing the donor substrate in the embrittlement region using a heat treatment; and
strengthening the interfaces with an anneal.

These temperature increases generate stresses in the structure comprising the donor substrate, the bonding layer and the support substrate via the differential thermal behavior caused by the donor substrate and the support substrate having different thermal expansion coefficients. These stresses can cause defects to appear in the structure (bulk defects and interface defects) and even to a substrate delaminating, depending on their magnitude.

The temperature increases are particularly large in the step of fracturing the donor substrate and in the annealing step for strengthening the interfaces, which steps are executed at temperatures of several hundred degrees Celsius, thus generating stresses of very high magnitudes in the structure. The step of fracturing the donor substrate and the annealing step for strengthening the interfaces are, therefore, steps that promote the appearance of defects in the structure and even delamination of a substrate.

BRIEF SUMMARY

The present disclosure aims to overcome all or some of the aforementioned drawbacks, and relates to a process for transferring a layer, comprising the following steps:
(a) providing a donor substrate and a support substrate made of materials having a first and second thermal expansion coefficient, respectively;
(b) forming an embrittlement region in the donor substrate so as to delimit a first part and a second part in the donor substrate on either side of the embrittlement region, the first part being intended to form the layer to be transferred to the support substrate;
(c) forming what is called a bonding layer between the first part of the donor substrate and the support substrate, the bonding layer having a preset thickness; and
(d) assembling the donor substrate to the support substrate, the transfer process being noteworthy in that it comprises the following step:
(e) exposing, in succession, portions of the embrittlement region to electromagnetic irradiations for an exposure time at a given power density, the electromagnetic irradiations belonging to a spectral domain chosen so that the support substrate, the bonding layer and the donor substrate are transparent, transparent and absorbent, respectively, in the spectral domain, the exposure time being chosen depending on the thickness of the bonding layer so that the temperature of the support substrate remains below a threshold during the exposure time, above which threshold defects are liable to appear in the structure comprising the support substrate, the bonding layer and the donor substrate, the exposure time being chosen depending on the power density in order to activate kinetics that weaken the embrittlement region.

Such a transfer process, according to the disclosure, thus allows a localized heat treatment to be applied by exposing, in succession, portions of the embrittlement region to electromagnetic irradiations. Therefore, the electromagnetic irradiations propagate, in the support substrate and the bonding layer, through a small section corresponding to the exposed section of a portion of the embrittlement region. The exposed section of the support substrate, of the bonding layer and of the donor substrate is sufficiently small that the total section of the support substrate and donor substrate is only subjected to an infinitesimal temperature increase. Thus, this localized heat treatment avoids the risk of defects appearing, or even of delamination, when the first and second thermal expansion coefficients are significantly different. Therefore, this localized heat treatment differs from a prior art blanket heat treatment of the entire structure comprising the donor substrate, the support substrate and the bonding layer.

Furthermore, the presence of the bonding layer is essential as it allows the support substrate to be thermally decoupled from the first part of the donor substrate, which absorbs the electromagnetic irradiations. Specifically, heat given off after absorption is liable to diffuse toward the support substrate via the bonding layer. This diffusion of heat toward the support substrate is undesirable as it is desired to prevent the support substrate from being subjected to a temperature increase that could lead to the generation of stresses via the differential thermal behavior of the donor substrate and the support substrate, as explained above. This is why the exposure time is chosen depending on the thickness of the bonding layer in order to obtain this thermal decoupling, which decoupling allows the temperature of the support substrate during the exposure time to be kept below a threshold above which defects are liable to appear in the structure comprising the support substrate, the bonding layer and the donor substrate. The term "defects" is understood to mean bulk defects in the support substrate and donor substrate, and defects at the interface between the donor substrate and the bonding layer, and at the interface between the support substrate and the bonding layer.

The step of fracturing the donor substrate in the embrittlement region may be executed concomitantly with step (e) if the exposure time and the power density are suitably chosen. The step of fracturing the donor substrate in the embrittlement region may also be executed after step (e). Step (e) allows kinetics that weaken the embrittlement region to be activated to the point that a simple subsequent mechanical action or a subsequent low-temperature heat treatment will be enough to fracture the donor substrate. Of course, the subsequent heat treatment will be executed at a temperature greatly below a temperature above which defects are liable to appear, which is made possible by the activation of the weakening kinetics in step (e).

Optional strengthening anneals will possibly be carried out after the donor substrate has been fractured. The temperature increase employed in these strengthening anneals does not generate high enough stresses to cause defects or a delamination because the transferred layer, i.e., the first part of the donor substrate, has a sufficiently small thickness compared to the initial thickness of the donor substrate. This small thickness does not allow a differential thermal behavior to be induced with the support substrate having as effects the appearance of defects or delamination.

According to one embodiment, the exposure time is chosen depending on the thickness of the bonding layer so that the thermal diffusion length in the bonding layer is smaller than or equal to the thickness of the bonding layer.

Thus, the temperature of the support substrate may be kept, during the exposure time, below the threshold above which defects are liable to appear in the structure comprising the support substrate, the bonding layer and the donor substrate.

According to one embodiment, the electromagnetic irradiations are electromagnetic pulses, and the length of each electromagnetic pulse respects the following relationship: $e \geq \sqrt{2D\tau}$; where D is the thermal diffusion coefficient of the bonding layer, $\tau$ is the length of one electromagnetic pulse, and e is the thickness of the bonding layer, $\tau$ preferably being between 10 ns and 10 µs, and e preferably being lower than 10 µm.

Thus, such electromagnetic pulses are tailored to sufficiently reduce diffusion of heat into the support substrate, via the bonding layer, after absorption, so that the temperature of the support substrate remains below a threshold during the exposure time, above which threshold defects are liable to appear in the structure comprising the support substrate, the bonding layer and the donor substrate. The length of each electromagnetic pulse is tailored so that the thermal diffusion length in the bonding layer is smaller than the thickness of the bonding layer. The energy delivered by each electromagnetic pulse can, therefore, be evacuated from the first part of the donor substrate before the arrival of the following electromagnetic pulse. The smaller the thermal diffusion length is compared to the thickness of the bonding layer, the better the thermal decoupling between the support substrate and the first part of the donor substrate will be. The number of pulse periods and the duty cycle are tailored so as to activate kinetics that weaken the embrittlement region.

According to one embodiment, step (e) is executed using at least one laser emitting the electromagnetic irradiations, the laser being moved so as to expose, in succession, the portions of the embrittlement region.

Thus, when the laser emits continuous wave electromagnetic irradiations, the speed with which the laser is moved is adjusted so as to obtain the desired exposure time for each portion of the embrittlement region. When the laser emits electromagnetic pulses, the exposure time for a portion of the embrittlement region corresponds to the sum of the lengths of the electromagnetic pulses emitted onto the portion.

Advantageously, the donor substrate has a thermal conductivity, and the bonding layer has a thermal conductivity that is lower than the thermal conductivity of the donor substrate, the thermal conductivity of the bonding layer preferably respecting the following relationship:

$$\sigma_{CL} \leq \frac{1}{10}\sigma_{SD}$$

where $\sigma_{CL}$ is the thermal conductivity of the bonding layer and $\sigma_{SD}$ is the thermal conductivity of the donor substrate.

Thus, such a bonding layer allows the thermal decoupling between the support substrate and the first part of the donor substrate to be improved with an intrinsic thermal insulation.

According to one embodiment, step (d) is executed at a temperature below a threshold above which defects are liable to appear in the structure comprising the support substrate, the bonding layer and the donor substrate, the temperature preferably being below 300° C. and even more preferably below 200° C.

Advantageously, the temperature at which step (d) is executed is chosen so that the support substrate and the bonding layer exhibit an interface having a bonding energy such that they are reversibly assembled, the temperature preferably being below 250° C. and even more preferably below 150° C.

The bonding energy preferably lies between 0.1 J/m² and 0.4 J/m², and is preferably substantially equal to 0.2 J/m².

According to one embodiment, the transfer process comprises the following steps:
  detaching the support substrate from the bonding layer after step (e);
  providing what is called a final support substrate;
  assembling the donor substrate to the final support substrate by way of the bonding layer; and
  fracturing the donor substrate in the embrittlement region.

Thus, the support substrate can be detached from the bonding layer because the local heat treatment of step (e) does not strengthen the interface between the support substrate and the bonding layer, the support substrate being thermally decoupled from the first part of the donor substrate. Transfer of the layer to the final support substrate may prove to be useful when the latter has properties desired for the envisaged application, but is not compatible with the optical properties required for the execution of step (e). Moreover, activation of the weakening kinetics in step (e) must be carried out in the presence of a support substrate acting as a mechanical stiffener in order to prevent blistering of the donor substrate.

According to one embodiment, the exposure time is chosen depending on the power density in order to fracture the donor substrate in the embrittlement region.

Thus, it is possible to fracture the donor substrate directly if the support substrate already has the properties desired for the envisaged application. The irradiations raise each portion of the embrittlement region to a temperature below the melting point of the material from which the donor substrate is made.

According to one embodiment, the material from which the donor substrate is made is a semiconductor, preferably selected from the group comprising silicon, germanium, silicon-germanium, and III-V materials such as gallium nitride, gallium arsenide and indium phosphide.

According to one embodiment, the material from which the support substrate is made is selected from the group comprising silicon, quartz, silica, sapphire, diamond, and glass.

According to one embodiment, the bonding layer is a dielectric layer, preferably made from silicon dioxide or a nitride.

According to one embodiment, the embrittlement region is formed during step (b) by implanting species such as hydrogen and/or helium.

BRIEF DESCRIPTION OF THE DRAWINGS

Other features and advantages will become apparent from the following description of one embodiment of a transfer process according to the disclosure, given by way of non-limiting example, with reference to the accompanying drawings in which.

DETAILED DESCRIPTION

Figure 1:
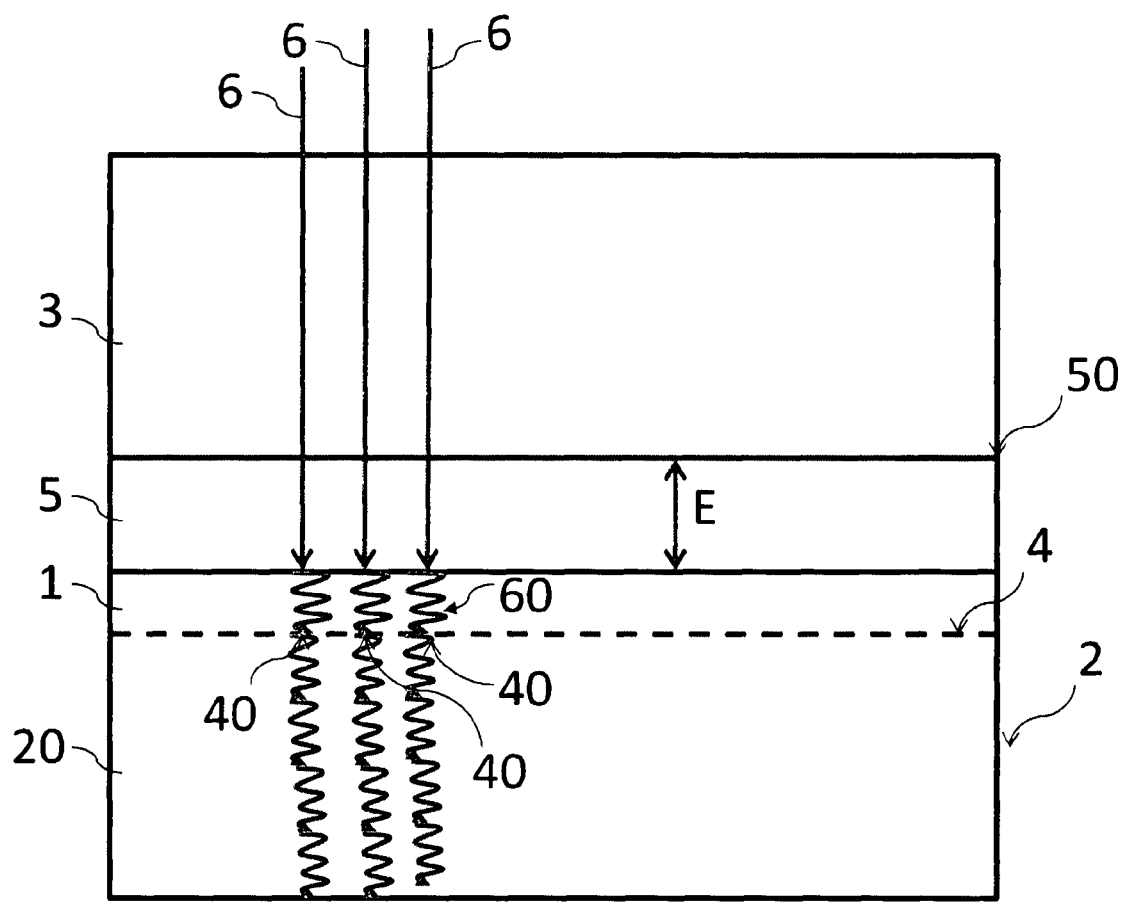
FIG. 1 is a schematic view of a structure illustrating one embodiment according to the disclosure.

The transfer process illustrated in FIG. 1 is a process for transferring a layer 1, comprising the following step: (a) providing a donor substrate 2 and a support substrate 3 made of materials having a first and a second thermal expansion coefficient (denoted "CTE" below), respectively. The material from which the donor substrate 2 is made is a semiconductor, preferably selected from the group comprising silicon, germanium, silicon-germanium, and III-V materials such as gallium nitride, gallium arsenide and indium phosphide. The material from which the support substrate 3 is made is preferably selected from the group comprising silicon, quartz, silica, sapphire, diamond and glass. By way of non-limiting example, the CTE of silicon is approximately $3.6 \times 10^{-6}$ K$^{-1}$. The CTE of sapphire is approximately $5 \times 10^{-6}$ K$^{-1}$. The CTE of quartz is approximately $6 \times 10^{-7}$ K$^{-1}$. Stresses are generated in the donor substrate 2 and/or the support substrate 3 if the respective CTEs of the donor substrate 2 and the support substrate 3 are different by more than 10% at room temperature, or even during the subsequent temperature increases. These stresses may lead to the appearance of defects or even to delamination of a substrate 2, 3 depending on their magnitude.

The transfer process illustrated in FIG. 1 comprises the following step: (b) forming an embrittlement region 4 in the donor substrate 2 so as to delimit a first part 1 and a second part 20 in the donor substrate 2 on either side of the embrittlement region 4, the first part 1 being intended to form the layer 1 to be transferred to the support substrate 3.

The embrittlement region 4 is formed in step (b) by implanting species such as hydrogen and/or helium. It is possible to implant only a single species such as hydrogen, but also to implant a number of species, such as hydrogen and helium, sequentially. The implantation parameters, essentially dose and energy, are set depending on the nature of the species and of the donor substrate 2.

The transfer process illustrated in FIG. 1 comprises the following step: (c) forming what is called a bonding layer 5 between the first part 1 of the donor substrate 2 and the support substrate 3, the bonding layer 5 having a preset thickness E. The bonding layer 5 may be a dielectric layer, preferably made from silicon dioxide or a nitride. The bonding layer 5 may be formed on the first part 1 of the donor substrate 2 and/or on the support substrate 3, for example, by thermal oxidation or by deposition. In the case where the donor substrate 2 is made of silicon, the bonding layer 5 is preferably silicon dioxide. The bonding layer 5 may, therefore, be produced on the support substrate 3, thereby replacing or complementing the bonding layer 5 formed on the donor substrate 2.

The order of execution of steps (b) and (c) may be reversed. When the bonding layer 5 is formed in step (c) by thermal oxidation, step (b) is executed after step (c). This is because the thermal budget required to form the bonding layer 5 in this way is high and could lead to untimely fracturing of the donor substrate 2 in the embrittlement region 4. It will be noted that forming the bonding layer 5 by thermal oxidation allows an excellent interface quality to be obtained.

In contrast, when the bonding layer 5 is formed in step (c) by deposition, for example, by low-temperature (about 250° C.) chemical vapor deposition (CVD), then the thermal budget is sufficiently low for the donor substrate 2 not to be fractured in the embrittlement region 4, and step (b) may be executed before step (c).

The transfer process illustrated in FIG. 1 comprises the following step: (d) assembling the donor substrate 2 to the support substrate 3. Step (d) may be executed by molecular bonding.

The transfer process illustrated in FIG. 1 comprises the following step: (e) exposing, in succession, portions 40 of the embrittlement region 4 to electromagnetic irradiations 6 (symbolized by solid arrows) for an exposure time at a given power density. The electromagnetic irradiations 6 belong to a spectral domain chosen so that the support substrate 3, the bonding layer 5 and the donor substrate 2 are transparent, transparent and absorbent, respectively, in the spectral domain. The electromagnetic irradiations 6 absorbed in the donor substrate 2 are symbolized by wavelets 60.

By way of non-limiting example, if a structure in which:
the donor substrate 2 is made of silicon;
the bonding layer 5 is made of silicon dioxide; and
the support substrate 3 is made of sapphire,
is considered, then a first suitable spectral domain covers the following wavelength range: 0.3 µm-0.5 µm. A second suitable spectral domain covers the following wavelength range: 1.5 µm-2.5 µm provided that the silicon from which the donor substrate 2 is made is highly doped. The silicon may be highly p-doped, for example, with a boron concentration higher than $5 \times 10^{18}$ atoms/cm$^3$. The silicon may be highly n-doped, for example, with an arsenic or phosphorus concentration higher than $5 \times 10^{18}$ atoms/cm$^3$. These first and second spectral domains can also be used when the support substrate 3 is made of quartz.

The length of time for which the portions 40 of the embrittlement region 4 are exposed to the electromagnetic irradiations 6 is chosen depending on the thickness E of the bonding layer 5 so that the temperature of the support substrate 3 remains below a threshold, during the exposure time, above which defects are liable to appear in the structure comprising the support substrate 3, the bonding layer 5 and the donor substrate 2. Furthermore, the exposure time is chosen depending on the power density in order to activate kinetics that weaken the embrittlement region 4. For example, the electromagnetic irradiations 6 may be electromagnetic pulses, the length of each electromagnetic pulse respecting the following relationship: $e \geq \sqrt{2D\tau}$; where D is the thermal diffusion coefficient of the bonding layer 5, $\tau$ is the length of one electromagnetic pulse, and e is the thickness of the bonding layer 5, $\tau$ preferably being between 10 ns and 10 µs, and e preferably being lower than 10 µm. The number of periods and duty cycle of the electromagnetic pulses is chosen in order to activate kinetics that weaken the embrittlement region 4. By way of non-limiting example, a structure is considered in which:

the donor substrate 2 is made of silicon;
the bonding layer 5 is made of silicon dioxide and has a thickness E substantially equal to 2 µm; and
the support substrate 3 is made of sapphire,
the electromagnetic pulses are delivered by a laser with an energy of 1.8 J·M$^{-2}$, τ=1 µs and the absorption coefficient is 10000 cm$^{-1}$.

The thermal conductivity of the silicon-dioxide bonding layer 5 is about 1.4 W·m$^{-1}$·K$^{-1}$, whereas the thermal conductivity of the silicon donor substrate 2 is about 148 W·m$^{-1}$·K$^{-1}$.

Therefore the following relationship is satisfied:

$$\sigma_{CL} \approx \frac{1}{100}\sigma_{SD};$$

where $\sigma_{CL}$ is the thermal conductivity of the bonding layer 5 and $\sigma_{SD}$ is the thermal conductivity of the donor substrate 2.

Figure 2:
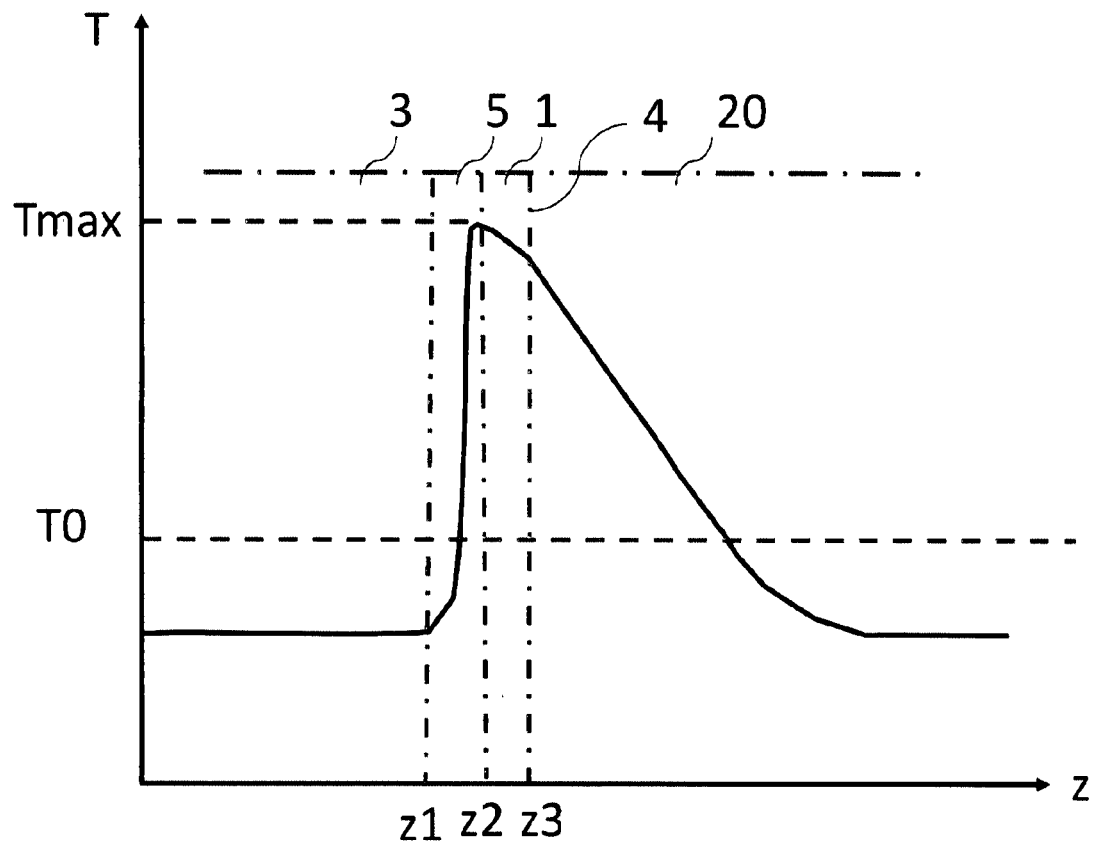
FIG. 2 is a graph showing the temperature (T), on the y-axis, of the structure illustrated in FIG. 1 as a function of depth (z), on the x-axis.

When step (e) is executed under the above conditions, the temperature profile illustrated in FIG. 2 is obtained in the structure. Heat produced by absorption of the electromagnetic irradiations 6 by the layer 1 to be transferred diffuses:

for z>z$_3$, i.e., into the second part 20 of the donor substrate 2; and
for z$_1$<z<z$_2$, i.e., into the bonding layer 5.

The temperature obtained for z<z$_1$, i.e., in the support substrate 3, is below a threshold (denoted T$_0$ in FIG. 2) above which defects are liable to appear in the structure comprising the support substrate 3, the bonding layer 5 and the donor substrate 2. The support substrate 3 is, therefore, sufficiently thermally decoupled from the first part 1 of the donor substrate 2.

The exposure time may also be chosen depending on the power density in order to fracture the donor substrate 2 in the embrittlement region 4. The electromagnetic irradiations 6 raise each portion 40 of the embrittlement region 4 to a temperature below the melting point of the material from which the donor substrate 2 is made. By way of non-limiting example, when the donor substrate 2 is made of silicon, the electromagnetic irradiations 6 raise each portion 40 of the embrittlement region 4 to a temperature preferably between 800° C. and 1400° C., corresponding to the parameter T$_{max}$ in FIG. 2, the melting point of silicon being substantially equal to 1415° C.

Step (e) may be executed using at least one laser to emit the electromagnetic irradiations 6, the laser being scanned over the assembly so as to expose, in succession, the portions 40 of the embrittlement region 4. By way of example, the laser may be a pulsed laser, for example, a YAG laser tuned to 1.06 µm, and equipped with a frequency doubling or tripling system. The laser may also be an erbium fiber laser emitting at 1.5 µm. The laser may be a continuous wave laser, for example, a dye laser allowing the wavelength to be chosen. In the case of a continuous wave laser, the laser beam is scanned so as to expose the portions 40 of the embrittlement region 4.

Step (d) is executed at a temperature below a threshold above which defects are liable to appear in the support substrate 3 and the donor substrate 2, the temperature preferably being below 300° C. and even more preferably below 200° C.

Furthermore, the temperature at which step (d) is executed is chosen so that the support substrate 3 and the bonding layer 5 exhibit an interface 50 having a bonding energy such that they are reversibly assembled, the temperature preferably being below 250° C. and even more preferably below 150° C.

According to one embodiment (not shown), the transfer process comprises the following steps:

detaching the support substrate 3 from the bonding layer 5 after step (e);
providing what is called a final support substrate;
assembling the donor substrate 2 to the final support substrate by way of the bonding layer 5; and
fracturing the donor substrate 2 in the embrittlement region 4.

Of course, the embodiment described above in no way limits the scope of the disclosure. Additional features and improvements may be added thereto in other variants without, however, departing from the scope of the disclosure.

The invention claimed is:

1. A process for transferring a layer comprising the following steps:
   (a) providing a donor substrate and a support substrate made of materials having a first and second thermal expansion coefficient, respectively;
   (b) forming an embrittlement region in the donor substrate so as to delimit a first part and a second part in the donor substrate on either side of the embrittlement region, the first part forming the layer to be transferred to the support substrate;
   (c) forming a bonding layer between the first part of the donor substrate and the support substrate, the bonding layer having a preset thickness;
   (d) assembling the donor substrate to the support substrate; and
   (e) exposing, in succession, portions of the embrittlement region to electromagnetic irradiations for an exposure time at a given power density, the electromagnetic irradiations belonging to a spectral domain chosen so that the support substrate, the bonding layer and the donor substrate are transparent, transparent and absorbent, respectively, in the spectral domain, the exposure time being chosen depending on the thickness of the bonding layer so that the temperature of the support substrate remains below a threshold during the exposure time, above which threshold defects are liable to appear in the structure comprising the support substrate, the bonding layer and the donor substrate, the exposure time being chosen depending on the power density in order to activate kinetics that weaken the embrittlement region.

2. The transfer process according to claim 1, wherein the exposure time is chosen depending on the power density in order to fracture the donor substrate in the embrittlement region.

3. The transfer process according to claim 1, wherein the donor substrate comprises a material selected from the group consisting of silicon, germanium, silicon-germanium, and a III-V material.

4. The transfer process according to claim 1, wherein the electromagnetic irradiations are electromagnetic pulses, and wherein the length of each electromagnetic pulse respects the following relationship: e≥√{2Dτ}; where D is the thermal diffusion coefficient of the bonding layer, τ is the length of one electromagnetic pulse, and e is the thickness of the bonding layer, τ is between 0 ns and 10 µs, and e is lower than 10 µm.

5. The transfer process according to claim 1, wherein step (e) is executed using at least one laser emitting the electromagnetic irradiations, the laser being moved so as to expose, in succession, the portions of the embrittlement region.

6. The transfer process according to claim 1, wherein the donor substrate has a thermal conductivity, and wherein the bonding layer has a thermal conductivity that is lower than the thermal conductivity of the donor substrate, the thermal conductivity of the bonding layer respecting the following relationship:

$$\sigma_{CL} \leq \frac{1}{10}\sigma_{SD};$$

where $\sigma_{CL}$ is the thermal conductivity of the bonding layer and $\sigma_{SD}$ is the thermal conductivity of the donor substrate.

7. The transfer process according to claim 1, wherein the support substrate comprises a material selected from the group consisting of silicon, quartz, silica, sapphire, diamond, and glass.

8. The transfer process according to claim 7, wherein the bonding layer is a dielectric layer.

9. The transfer process according to claim 8, wherein the embrittlement region is formed in step (b) by implanting atomic species in the donor substrate.

10. The transfer process according to claim 1, wherein the exposure time is chosen depending on the thickness of the bonding layer so that the thermal diffusion length in the bonding layer is smaller than or equal to the thickness of the bonding layer.

11. The transfer process according to claim 10, wherein the electromagnetic irradiations are electromagnetic pulses, and in that wherein the length of each electromagnetic pulse respects the following relationship: $e \geq \sqrt{2D\tau}$; where D is the thermal diffusion coefficient of the bonding layer, $\tau$ is the length of one electromagnetic pulse, and e is the thickness of the bonding layer, $\tau$ is between 0 ns and 10 µs, and e is lower than 10 µm.

12. The transfer process according to claim 11, wherein step (e) is executed using at least one laser emitting the electromagnetic irradiations, the laser being moved so as to expose, in succession, the portions of the embrittlement region.

13. The transfer process according to claim 12, wherein the donor substrate has a thermal conductivity, and wherein the bonding layer has a thermal conductivity that is lower than the thermal conductivity of the donor substrate, the thermal conductivity of the bonding layer respecting the following relationship:

$$\sigma_{CL} \leq \frac{1}{10}\sigma_{SD};$$

where $\sigma_{CL}$ is the thermal conductivity of the bonding layer and $\sigma_{SD}$ is the thermal conductivity of the donor substrate.

14. The transfer process according to claim 13, wherein step (d) is executed at a temperature below a threshold above which defects are liable to appear in the structure comprising the support substrate, the bonding layer and the donor substrate.

15. The transfer process according to claim 14, wherein the temperature at which step (d) is executed is chosen so that the support substrate and the bonding layer exhibit an interface having a bonding energy such that they are reversibly assembled, the temperature being below 250° C.

16. The transfer process according to claim 1, wherein step (d) is executed at a temperature below a threshold above which defects are liable to appear in the structure comprising the support substrate, the bonding layer and the donor substrate.

17. The transfer process according to claim 16, wherein the temperature at which step (d) is executed is chosen so that the support substrate and the bonding layer exhibit an interface having a bonding energy such that they are reversibly assembled, the temperature being below 250° C.

18. The transfer process according to claim 17, further comprising:
    detaching the support substrate from the bonding layer after step (e);
    providing a final support substrate;
    assembling the donor substrate to the final support substrate by way of the bonding layer; and
    fracturing the donor substrate in the embrittlement region.

19. The transfer process according to claim 16, wherein the temperature is below 300° C.

20. The transfer process according to claim 19, wherein the temperature is below 200° C.

* * * * *